(12) United States Patent
Shinohara

(10) Patent No.: US 7,301,417 B2
(45) Date of Patent: Nov. 27, 2007

(54) PULSE WIDTH MODULATION METHOD AND APPARATUS

(75) Inventor: Yoshiaki Shinohara, Yokohama (JP)

(73) Assignee: Digian Technology, Inc., Yokohama (JP)

( * ) Notice: Subject to any disclaimer, the term of this patent is extended or adjusted under 35 U.S.C. 154(b) by 188 days.

(21) Appl. No.: 11/089,423

(22) Filed: Mar. 22, 2005

(65) Prior Publication Data

US 2005/0212576 A1    Sep. 29, 2005

(30) Foreign Application Priority Data

Mar. 25, 2004    (JP)    ............................. 2004-088493

(51) Int. Cl.
*H03K 7/00*    (2006.01)

(52) U.S. Cl. ...................... 332/106; 332/109; 327/172; 327/175; 327/176

(58) Field of Classification Search ................ 341/144; 331/74; 327/175, 166, 172, 176; 332/106, 332/109

See application file for complete search history.

(56) References Cited

U.S. PATENT DOCUMENTS 7,084,613 B2 *    8/2006    Harris et al. ................. 323/272

FOREIGN PATENT DOCUMENTS

| JP | 63-176020 | 7/1988 |
| JP | 07-094965 | 4/1995 |
| JP | 10-303657 | 11/1998 |
| JP | 2003-198373 | 7/2003 |

* cited by examiner

*Primary Examiner*—Arnold Kinkead
(74) *Attorney, Agent, or Firm*—James H. Walters

(57) ABSTRACT

Disclosed is a pulse width modulation method and apparatus capable of expressing as many values as possible in a pulse width modulation (PWM) period, while maintaining the center of pulse energy substantially equal to the center of the PWM period. For this end, prepared is the PWM pattern generator 20 including 2 kinds of PWM pulse generator 21 and 22 for generating pulses having the pulse width of 0~N times of the reference clock period in 1 PWM period corresponding to a predetermined number N of the reference clock period. The PWM pulse generators 21 and 22 are properly switched by the switching circuit 30 under control of the control circuit 40 for performing time averaging process so that the centers of energy of the output pulses is substantially equal to the center of the PWM period.

10 Claims, 4 Drawing Sheets

PULSE WIDTH MODULATION METHOD AND APPARATUS

FIELD OF INVENTION

The present invention relates to a pulse width modulation method and apparatus, more specifically to a pulse width modulation method and apparatus for a driver control circuit that drives a bridge configuration driver circuit in a class-D amplifier or the like.

BACKGROUND ART

Generally, an audio output amplifier for power amplifying an audio signal to drive a load such as, for example, a speaker or the like employs a class-D amplifier, wherein 4 switching devices such as, for example, CMOS transistors or the like are connected in a bridge configuration for improving power efficiency.

The 4 switching devices constituting the bridge section perform pulse width modulation in response to the input audio signal using a pulse width modulator (PWM) for ON/OFF controlling the bridge control circuit by the pulse width modulated signal. The ON/OFF control of the switching devices drives highly efficiently the load such as the speaker or the like.

There are two typical pulse width modulation schemes, one is an analog modulation scheme using an analog triangle wave and the other is a digital modulation scheme using a reference clock signal. The former, i.e., the analog modulation scheme is able to continuously control the pulse width. On the other hand, the latter, i.e., the digital modulation scheme is able to perform discretely pulse width modulation depending on the reference clock. Also, in case of the digital modulation scheme, there is a need for a high reference clock frequency in proportion to the number of values to be expressed. However, as the reference clock frequency becomes higher, associated circuits become expensive and more noise is generated. It is therefore preferable to realize a pulse width modulation technique capable of expressing as many values as possible using the lowest possible reference clock frequency.

Various conventional techniques on the pulse width modulation for such digital audio amplification or the like are disclosed. See, for example, JP-7-94965A (page 2, FIG. 1) and JP-10-303657A (pages 3-4, FIG. 1).

Incidentally, in the digital pulse width modulation scheme, there are a single-side modulation scheme and a both-side modulation scheme. FIG. 6 is a timing chart for the purpose of describing the basic operation of the single-side modulation scheme. In the single-side modulation scheme, pulse width is modulated at only one side (for example, the falling portion) in the pulse width modulation (PWM) period. In FIG. 6, the horizontal axis represents time, particularly 1 PWM period corresponding to first~eighth reference clocks, while patterns "0"~"8" are shown in the vertical direction. Pulse width modulated pulses are modulated at the falling portions, while fixing the rising portions (or start points). In case of the pattern "0", an "L (or low)" level continues over the entire period of the first~eighth reference clocks, thereby outputting no pulse. In case of the pattern "1", a pulse having the width equal to 1 reference clock is outputted in the first reference clock period. In case of the pattern "2", a pulse having the width equal to 2 reference clocks is outputted in the first and second reference clock periods. Similarly, in case of the pattern "3", a pulse having the width equal to 3 reference clocks is outputted in the first~third reference clock periods. In case of the pattern 4, a pulse having the width equal to 4 reference clocks is outputted in the first~fourth reference clock periods. In case of the pattern 5, a pulse having the width equal to 5 reference clock is outputted in the first~fifth clock periods. In case of the pattern 6, a pulse having the width equal to 6 reference clocks is outputted in the first~sixth reference clock periods. In case of the pattern 7, a pulse having the width equal to 7 reference clocks is generated in the first~seventh reference clock periods. Finally, in case of the pattern 8, a pulse having the width equal to 8 reference clocks is outputted in the first~eighth reference clock periods.

As apparent from the above description, in case of the single-side modulation scheme, it is possible to express the pattern "0"~pattern "8", 9 values (patterns) in total in the first~eighth reference clock periods. In other words, in case of the single-side modulation scheme, it is possible to express (N+1) kinds of values in 1 PWM period comprising N reference clocks. However, since the center of the pulse energy does not remain constant depending on widths of pulse width modulation, it can not be used for high resolution applications.

On the other hand, FIG. 7 is a timing chart for the purpose of describing the operation of the both-side modulation scheme. In FIG. 7, the horizontal axis represents time, particularly 1 PWM period. In this particular example, an output pulse of either pattern "0", "1", "2", "3" or "4" respectively having the width of 0, 2, 4, 6 or 8 reference clock period is outputted in 1 PWM period comprising first~eighth reference clocks. In other words, since the pulse widths of the output pulses are multiplied by only even numbers of the reference clock period, the modulated outputs (patterns) that can be obtained are restricted to 5 (=8/2+1) in case of N=8, thereby less than the number as compared to the single-side modulation scheme. However, since the center of energy of each output pulse (pattern) is fixed to the center of the PWM period, it can be used for high resolution applications, for example, 16 bits.

SUMMARY OF THE INVENTION

As described hereinabove, it is preferable to realize a modulation scheme having the advantages of both of the single-side modulation scheme that expresses a larger number of values (or patterns) in 1 PWM period as well as of the both-side modulation scheme in which the center of energy of the output pulses is fixed to the center of the PWM period. However, it was impossible to realize the above ideal modulation scheme by the conventional single-side modulation scheme or the both-side modulation scheme, because they have disadvantages of shifting the centers of energy of the output pulses from the center of the clock period and limited values of the output pulses, respectively.

In light of the aforementioned disadvantages of the conventional technology, it is an object of the present invention to provide a pulse width modulation method and apparatus that can maintain the advantage of the single-side modulation scheme and is able to overcome or reduce the disadvantage thereof.

The pulse width modulation method according to the present invention is a method to output a plurality of patterns of different pulse width by modulating both rising and falling portions of the output pulses in a pulse width modulation (PWM) period including predetermined number N (N being any desired number larger than 1) of the reference clock in the pulse width modulation (PWM) period, wherein the output pulses comprise even number patterns having the centers of the pulses coinciding with the center of the PWM period and odd number patterns slightly shifting from the center of the PWM period and are (N+1) kinds having the pulse widths of 0~N times of the reference clock period, thereby performing time averaging process so that the center of energy of the output pulses is substantially equal to the center of the PWM period. According to the preferred embodiment of the present invention, the averaging process is performed by preparing 2 kinds of odd number patterns of the output pulses which are selected alternately. Alternatively, the averaging process is performed by alternately shifting the odd number patterns of the output pulses by 1 reference clock period.

On the other hand, the pulse width modulation apparatus according to the present invention is an apparatus for generating (N+1) kinds of output pulse patterns having pulse widths equal to 0~N times of the reference clock period by modulating pulse width at both end portions in the pulse width modulation (PWM) period including the predetermined number N (N being any desired number larger than 1) of the reference clock in response to the input data, comprising a PWM pattern generator for generating 2 kinds of pulses that have pulse centers offset in the opposite directions to each other from the center of the PWM period as some of the (N+1) kinds of the output pulse patterns, and a switching circuit for selectively switching the output pulses from the PWM pattern generator. According to the preferred embodiment of the present invention, the PWM pattern generator comprises first and second PWM pulse generators for generating a plurality of odd number patterns having centers of the pulses offset from one another, and a pulse generator for generating even number patterns having identical pulse centers. The switching circuit is controlled by a control circuit so that the first and second PWM pulse generators are switched alternately whenever any odd number pulse pattern is generated. The switching circuit comprises a plurality of multiplexers (MUXs) for selectively outputting the outputs from the odd number pulse generator from the corresponding first and the second PWM generators and an output MUX to which the outputs from the plurality of MUX and the pulse generator for the even number patterns are supplied. The control circuit for the switching circuit comprises a data recorder and a control circuit for the plurality of MUX. The control circuit for each MUX comprises a D-type flip-flop (D-FF) and an inverter connected between the Q output terminal and the D input terminal of the D-FF. The control circuit for MUX comprises a register, a comparator connected at the output side of the register and an adder for adding the outputs from the comparator and the register before being supplied to the register.

The pulse width modulation method and apparatus according to the present invention have the following practical advantages. That is, it is possible to provide a large number of output pulse values (patterns) like the conventional single-side modulation scheme, while the centers of energy of the output pulses is averaged in time to be equal to the center of the PWM period, thereby making it applicable to high resolution pulse width modulation. Additionally, means for achieving the above objectives are simple and less expensive because 2 kinds of output pulse generators are switched in time or the time when the output pulses are generated in the PWM period is shifted.

DESCRIPTION OF PREFERRED EMBODIMENT

Now, the construction and the operation of the pulse width modulation method and apparatus according to the preferred embodiment of the present invention will be described in detail by making reference to the accompanying drawings.

Figure 1A:
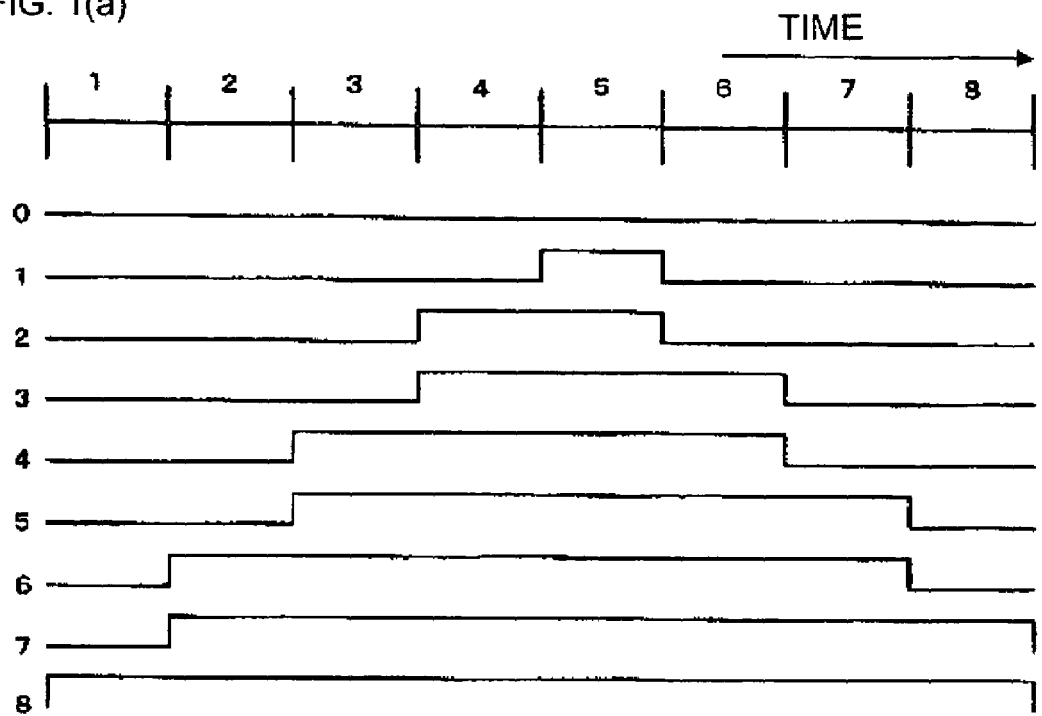
FIGS. 1(A) and (B) show plural kinds of output pulse patterns that are generated from 2 kinds of PWM pulse generators to be used in the pulse width modulation of the present invention.
Figure 1B:
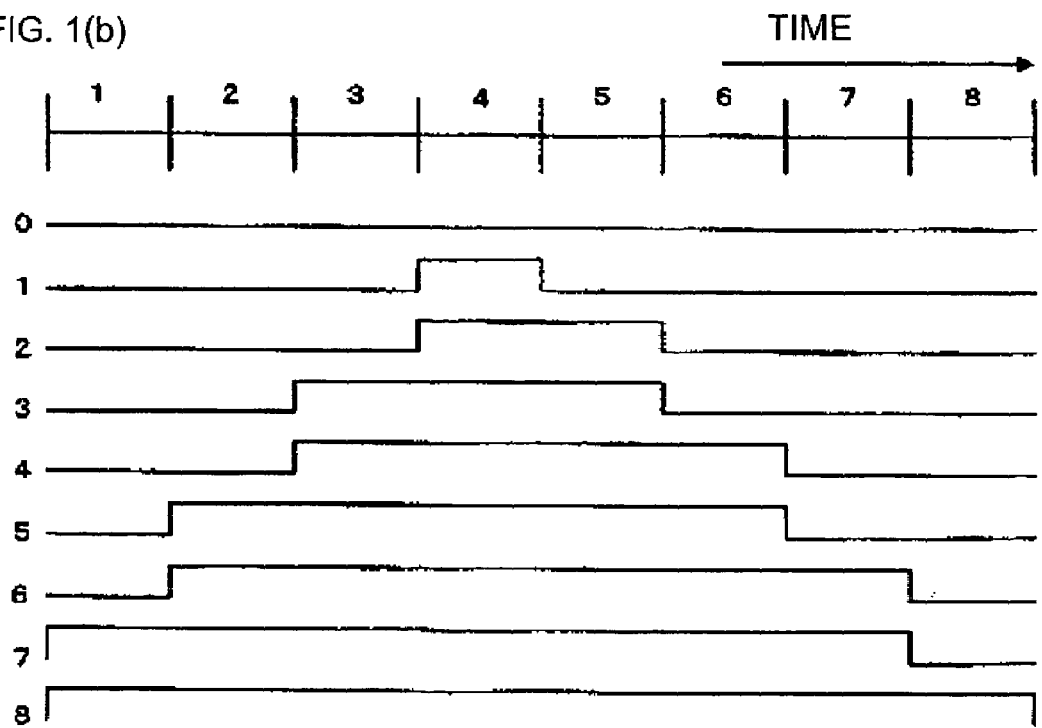

FIG. 1 is an illustration of the pulse width modulation method and apparatus according to the present invention. FIG. 1(A) shows first pulse width modulated outputs (referred to as first PWM pulses below), while FIG. 1(B) shows second pulse width modulated outputs (referred to as second PWM pulses below).

In FIGS. 1(A) and (B), the horizontal axes represent time, or 1 pulse width modulation (PWM) period of the reference clock. In this particular embodiment, 8 reference clocks, or first~eighth reference clocks constitute 1 pulse width modulation period (PWM period). Firstly, reference is made to FIG. 1(A) to describe the aforementioned first PWM pulses. In the 1 PWM period, in case of a pattern "0" of the output pulse, the output remains "L" over the entire reference clock period, thereby outputting no pulse. In case of a pattern "1", a pulse having the width of 1 reference clock is outputted in the fifth reference clock period. In case of a pattern "2", a pulse having the width of 2 reference clocks is outputted in the fourth and the fifth reference clock periods. In case of a patter "3", a pulse having the width of 3 reference clocks is outputted in the fourth~sixth reference clock periods. In case of a pattern "4", a pulse having the width of 4 reference clocks is outputted in the third~sixth reference clock periods. In case of a pattern "5", a pulse having the width of 5 reference clocks is outputted in the third~seventh reference clock period. In case of a pattern "6", a pulse having the width of 6 reference clocks is outputted in the second~seventh reference clock periods. In case of a pattern "7", a pulse having the width of 7 reference clocks is outputted in the second~eighth reference clock periods. Finally, in case of a pattern "8", a pulse having the width of 8 reference clocks is outputted in the first~eighth reference clock periods.

Now, reference is made to FIG. 1(B) for describing the aforementioned second PWM pulses. In case of a pattern "0", the output remains "L" over the entire 1 PWM period, thereby outputting no pulse. In case of a pattern "1", a pulse having the width of 1 reference clock is outputted in the fourth reference clock period. In case of a pattern "2", a pulse having the width of 2 reference clocks is outputted in the fourth and the fifth reference clock periods. In case of a pattern "3", a pulse having the width of 3 reference clocks is outputted in the third~fifth reference clock periods. In case of a pattern "4", a pulse having the width of 4 reference clocks is outputted in the third~sixth reference clock periods. In case of a pattern "5", a pulse having the width of 5 reference clocks is outputted in the second~sixth reference clock periods. In case of a pattern "6", a pulse having the width of 6 reference clocks is outputted in the second~seventh reference clock periods. In case of a pattern "7", a pulse having the width of 7 reference clocks is outputted in the first~seventh reference clock periods. Finally, in case of pattern "8", a pulse having the width of 8 reference clocks is outputted in the first~eighth reference clock periods (i.e., 1 PWM period).

As described hereinabove, the first PWM pulses and the second PWM pulses are the same as the above mentioned single-side modulation scheme in that 9, kinds (patterns) of pulses, i.e., the pattern "0"~the pattern "8" having the pulse widths of 0~8 times of the reference clock period are outputted. And there is no difference between the first PWM pulses and the second PWM pulses in this aspect. Also, it is to be noted that even number output pulses, i.e., codes "0", "2", "4", "6" and "8" (referred to as even patterns below) are identical (or common) to both the first PWM pulses and the second PWM pulses. And the pulses of these even number patterns coincide with the center of the PWM period. In other words, the pulses of such even number patterns are symmetrical with respect to the PWM period and centered at the mid point of the time 4 and 5.

On the other hand, the odd number output pulses having the width of odd number (1, 3, 5 or 7) times of the reference clock period (referred to as odd patterns below) are different from each other. That is, the odd patterns of the first PWM pulses are generated at the position lagged in time by 1 reference clock as compared to the corresponding odd patterns of the second PWM pulses. In other words, the odd patterns of the first PWM pulses are shifted to the right by 1 reference clock in 1 PWM period with respect to odd patterns of the second PWM pulses. As a result, the center positions of the pulses, or the centers of the pulse energy of the first PWM pulses as shown in FIG. 1(A) and those of the second PWM pulses as shown in FIG. 1(B) are equal to the center of either time 5 or 4, thereby shifting from the center position of the PWM period.

Now, the basic principle of the pulse width modulation method and apparatus according to the present invention by performing time averaging process for substantially equalizing the center of the pulse output energy of the aforementioned odd patterns to the center of the PWM period will be described by making reference to the block diagram in FIG. 2.

The pulse width modulation apparatus 10 according to the present invention comprises a PWM pattern generation circuit 20 including a first PWM pulse generator 21 and a second PWM pulse generator 22, a switching circuit (or SW circuit) 30 for switching the outputs from the first PWM pulse generator 21 and the second PWM pulse generator 22 and a control circuit (or SW control circuit) 40 for controlling the switching circuit 30. And the output pulses from the pulse width modulation apparatus 10 are supplied to, for example, a bridge circuit 50 for driving a load 60 such as a speaker.

Figure 2:
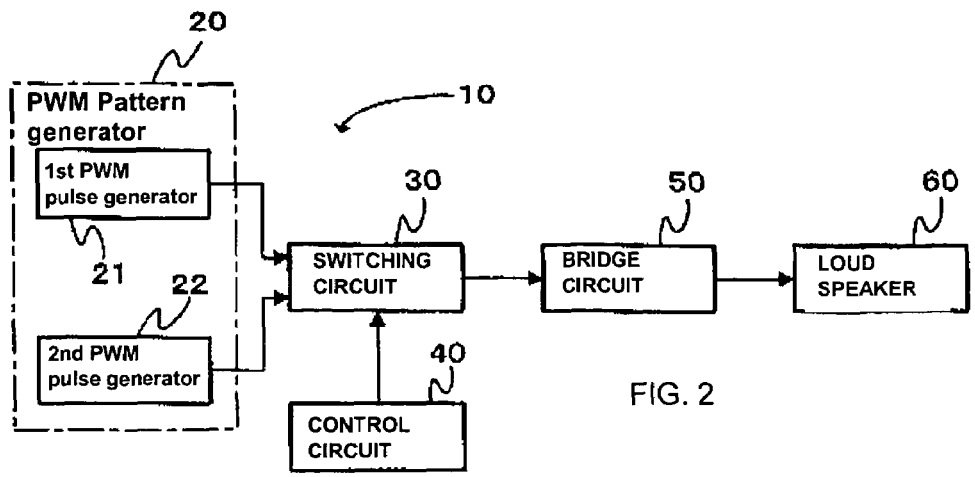
FIG. 2 is a functional block diagram to show the basic construction of the pulse width modulation according to the present invention.

In the pulse width modulation apparatus 10 in FIG. 2, the first PWM pulse generator 21 is a pulse generator for generating pulses in which the pulse centers of the odd patterns are shifted to the right from the center of the PWM period as shown in FIG. 1(A). On the other hand, the second PWM pulse generator 22 is a pulse generator for generating pulses in which the pulse centers of the odd patterns are shifted to the left from the center of the PWM period as shown in FIG. 1(B). The most important feature of the present invention is to perform time averaging process by providing the PWM pattern generation circuit 20 including 2 kinds of pulse generators (i.e., the first PWM pulse generator 21 and the second PWM pulse generator 22) and suitably switching the PWM pulse generators 21, 22 by the switching circuit 30 under control of the control circuit 40.

It is to be noted that the control circuit 40 is a circuit for controlling the switching operation of the switching circuit 30. The control circuit 40 performs the averaging process by controlling the switching circuit 30 in such a manner that the average value of the pulse energy in a given time is substantially equal to the center of the PWM period, thereby minimizing the influence in the frequency bandwidth. As described hereinafter, a switching signal is outputted in response to the result of judgment of a pulse width judgment circuit (not shown) that is placed at the front stage of the first PWM pulse generator 21 and the second PWM pulse generator 22.

The control circuit 40 may be assembled with logic circuits in such a manner that the first PWM pulse generator 21 and the second PWM pulse generator 22 are switched whenever any odd pattern output pulse, for example, the pattern "1" having the width of 1 (reference clock period) is generated. Constructions for the control circuit 40 and the switching circuit 30 to be switched by the control circuit 40 are known for a person having an ordinary skill in the art and may be chosen from various designs.

Figure 3:
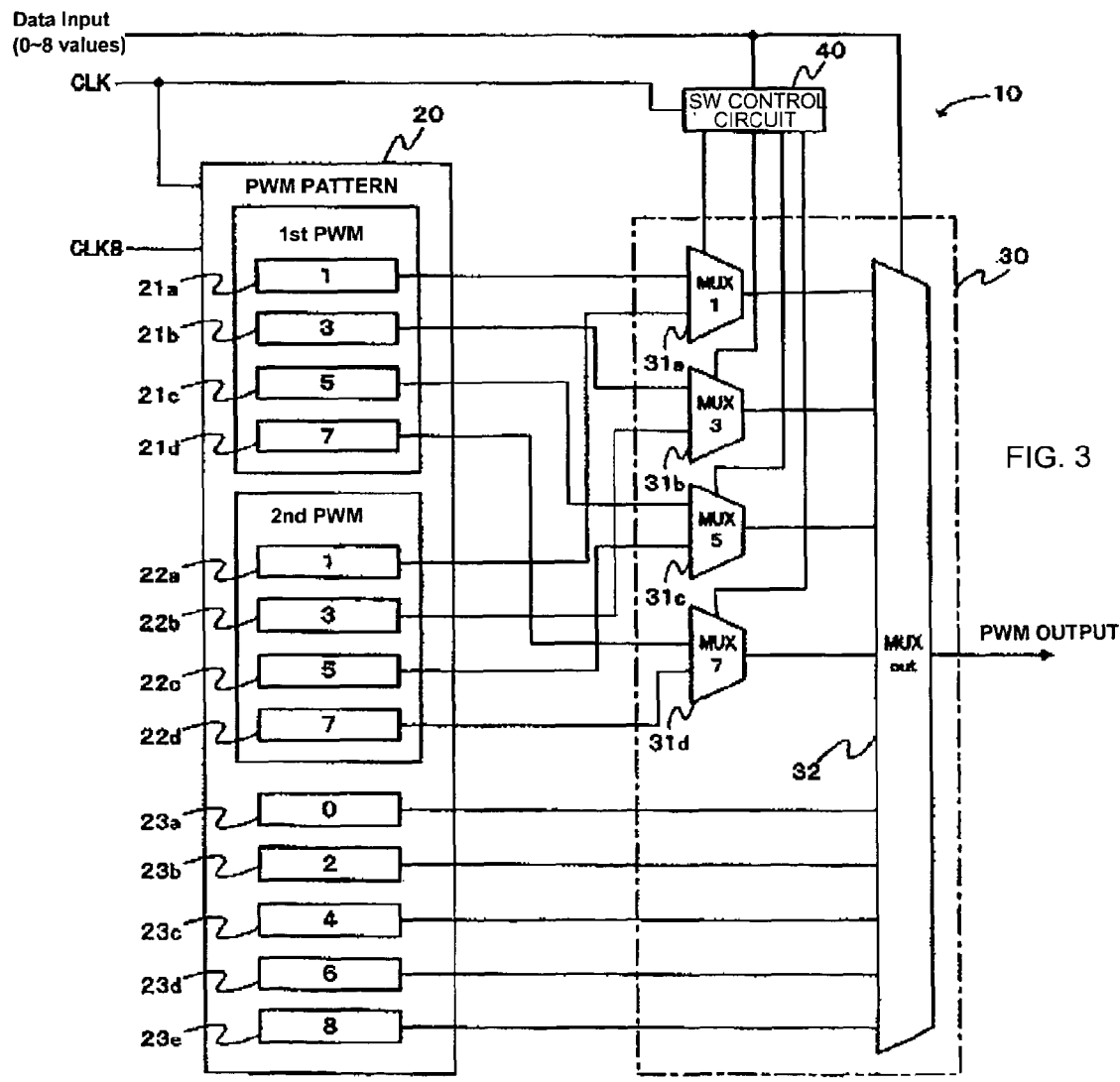
FIG. 3 is a block diagram of a preferred embodiment of the pulse width modulation apparatus according to the present invention.

Now, FIG. 3 is a block diagram of one example of the pulse width modulation method and apparatus according to the present invention. The pulse width modulation apparatus 10 as shown in FIG. 3 comprises the PWM pattern generator 20, the switching circuit 30 for switching the output pulses from the PWM pattern generator 20 and the SW control circuit 40 for controlling the switching operation of the switching circuit 30 as shown in FIG. 2. A clock signal (CLK) having the same period as the input data is supplied to the PWM pattern generator 20 and the SW control circuit 40. And applied to the MUX 32 in the switching circuit 30 and the SW control circuit 40 is the digital data (0~8 values) from an upper device (not shown). A CLK8 to be applied to the PWM pattern generator 20 is a clock signal having the frequency equal to 8 times of the CLK.

In the pulse width modulation apparatus 10 as shown in FIG. 3, the PWM pattern generator 20 comprises pulse generators 21*a*, 21*b*, 21*c* and 21*d* for generating the odd patterns "1", "3", "5" and "7" for the first PWM pulses, similarly pulse generators 22*a*, 22*b*, 22*c* and 22*d* for generating the odd patterns "1"~"7" for the second PWM pulses and pulse generators 23*a*, 23*b*, 23*c*, 23*d* and 23*e* for generating the even patterns "0", "2", "4", "6" and "8" which are common to the first PWM pulses and the second PWM pulses.

Now, the switching circuit 30 comprises multiplexers (referred to as MUXs below) 31*a*~31*d* and an output MUX 32. The output MUX 32 receives the outputs from the MUXs 31*a*~31*d* and the outputs from the pulse generators 23*a*~23*e* in the PWM pattern generator 20 as the inputs thereto and finally outputs a PWM output pulse from the output terminal thereof. The MUXs 31*a*~31*d* and the output MUX 32 perform switching operation by the control signal from the SW control circuit 40.

The MUX 31a selects for outputting to the output MUX 32 the output pulses from the first PWM pulse generator 21a and the second PWM pulse generator 22a which generate the odd pattern "1". The MUX 31b selects for outputting to the output MUX 32 the output pulses from the first PWM pulse generator 21b and the second PWM pulse generator 22b which generate the odd pattern "3". The MUX 31c selects for outputting to the output MUX 32 the output pulses from the first PWM pulse generator 21c and the second PWM pulse generator 22c which generate the odd pattern "5". And the MUX 31d selects for outputting to the output MUX 32 the output pulses from the first PWM pulse generator 21d and the second PWM pulse generator 22d which generate the odd pattern "7".

Now, the operation of the pulse width modulation apparatus 10 according to the present invention as shown in FIG. 3 will be described. When the data input as represented by the 0~8 values is 0, the output pulse from the pulse generator 23a in the PWM pattern generator 20 is directly outputted to the PWM output terminal through the output MUX 32. Similarly, when the data inputs are even patterns "2", "4", "6" and "8", the output pulses from the pulse generators 23b, 23c, 23d and 23e in the PWM pattern generator 20 are outputted as the PWM outputs through the output MUX 32.

On the other hand, when the input data is "1" which is one of the odd patterns, the output pulses from the first PWM pulse generator 21a and the second PWM pulse generator 22a are inputted to the MUX 31a and either one of the output pulses from the first PWM pulse generator 21a and the second PWM pulse generator 22a is outputted through the output MUX 32 as the PWM output pulse based on the control signal from the SW control circuit 40. Similarly, in case of the odd pattern "3", "5" or "7", the output pulses from the first PWM pulse generator 21b, 21c or 21d and the second PWM pulse generator 22b, 22c or 22d are inputted respectively to the MUX 31b, 31c or 31d and either one of the output pulses is selected based on the control signal from the SW control circuit 40 and outputted through the output MUX 32 as the PWM output pulse.

Figure 4:
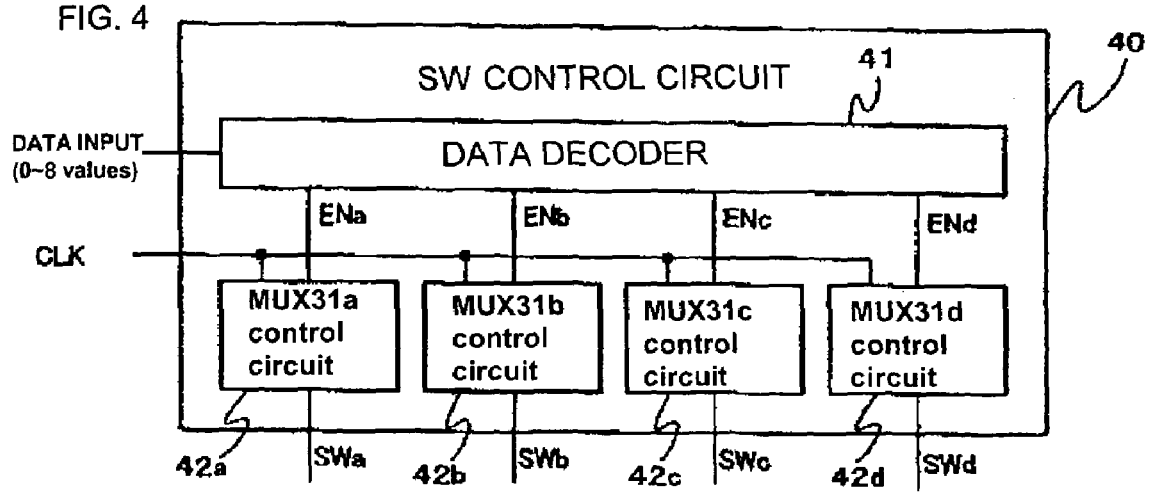
FIG. 4 is a block diagram to show the detailed construction of the SW control circuit in FIG. 3.

Now, FIG. 4 is a block diagram of the SW control circuit 40 for outputting the control signal which controls the switching of each of the aforementioned MUXs 31a~31d. The SW control circuit 40 comprises a data decoder 41 and control circuits 42a~42d for the MUXs 31a~31d. The data input (0~8 values) is inputted to the data decoder 41 and the CLK is inputted to each MUX control circuit 42a~42d. Also inputted to each MUX control circuit 42a~42d is an enable signal ENa~End from the data decoder 41 for outputting the switching signal SWa~SWd to the MUXs 31a~31d, respectively.

Figure 5A:
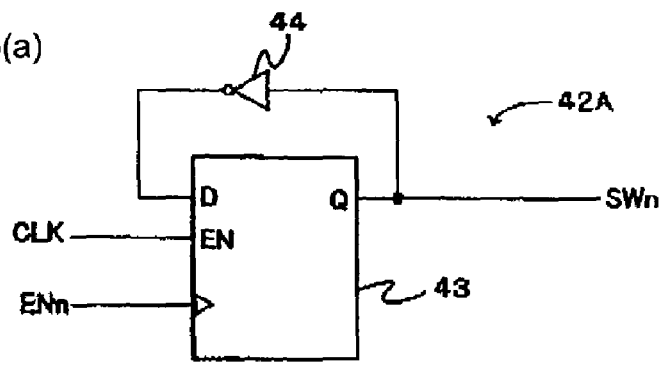
FIGS. 5(A) and (B) are two examples of the MUX control circuit in FIG. 4.
Figure 5B:
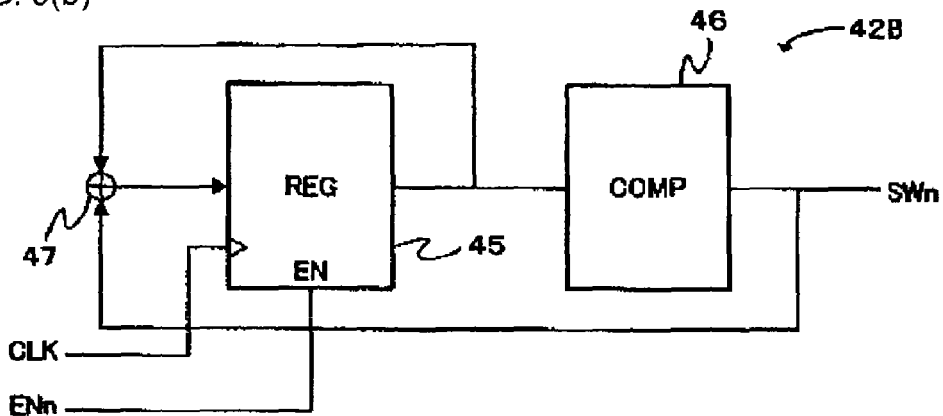
Figure 6:
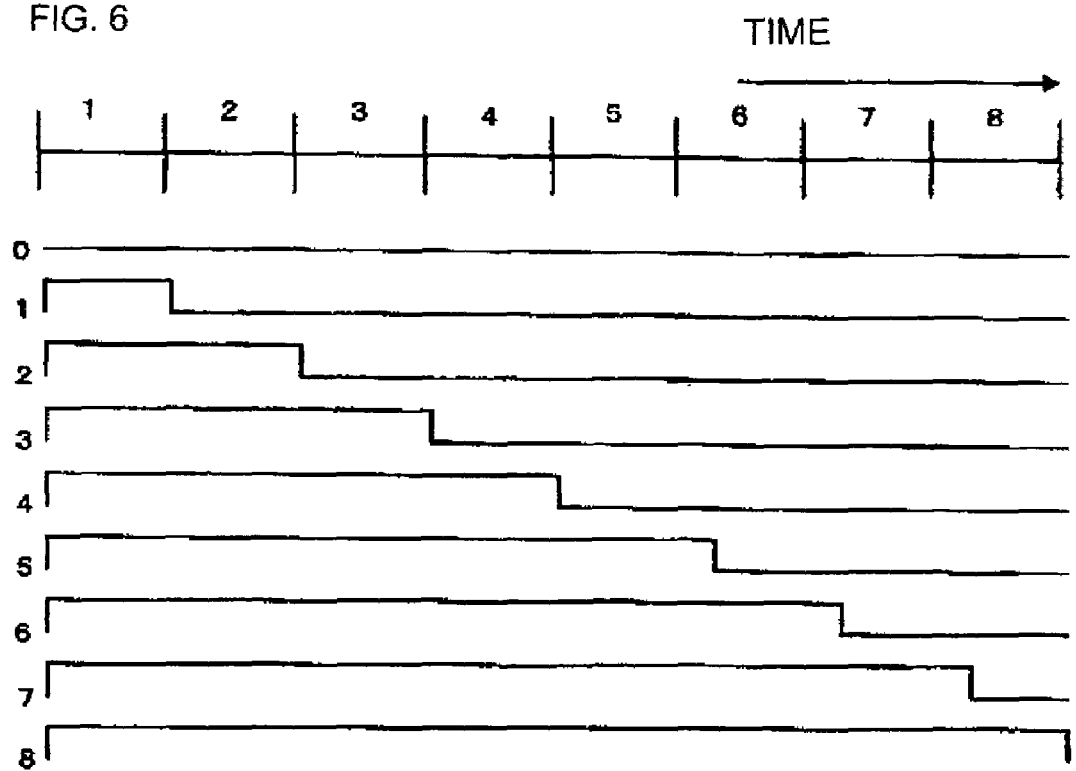
FIG. 6 shows output pulses in a typical single-side pulse width modulation scheme.
Figure 7:
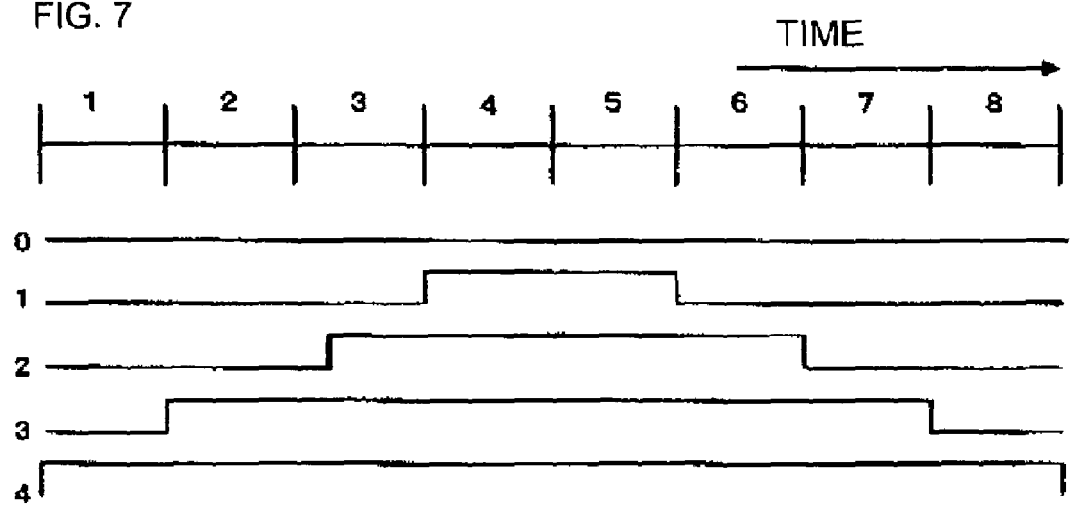
FIG. 7 shows output pulses in a typical both-side pulse width modulation scheme.

Concrete examples of the MUX control circuits 42a~42d are shown in FIG. 5(A) and FIG. 5(B). The MUX control circuit 42A as shown in FIG. 5(A) comprises a D-type flip-flop (referred to as D-FF below) 43 and an inverter (phase inverting circuit) 44 connected between the Q output terminal and the D terminal of the D-FF 43. The enable signal Enn and the CLK signal are inputted to the enable (EN) terminal and the CLK terminal of the D-FF 43, respectively. As a result, when the D-FF 43 is enabled by inputting the enable signal Enn, the alternately inverting switching signal SWn is outputted whenever the odd pattern "1", "3", "5" or "7" is outputted as the data input, thereby controlling the aforementioned first PWM pulse generator 21a~21d or the second PWM pulse generator 22a~22d alternately output the respective pulse.

On the other hand, the MUX control circuit 42B as shown in FIG. 5(B) comprises a register (REG) 45, a comparator (COMP) 46 and an adder 47. The added output from the adder 47 is inputted to the REG 45 and the CLK and the Enn are inputted to the CLK terminal and the enable (EN) terminal, respectively. The output signal from the REG 45 is inputted to the COMP 46 and also inputted to one of the input terminals of the adder 47. The COMP 46 outputs the switching signal SWn which is then inputted to the other input terminal of the adder 47. The COMP 46 compares the output signal from the REG 45 with the data (reference value) internally stored in advance. The MUX control circuit 42B performs the known primary delta-sigma ($\Delta$-$\Sigma$) modulation operation.

The basic principle of the pulse width modulation method and apparatus according to the present invention as well as the construction and the operation of the preferred embodiment thereof have been described in detail hereinabove. However, it is to be noted that such embodiment is nothing but an example of the present invention and the present invention should not be interpreted to such embodiment. It is easily understood that a person having an ordinary skill in the art can make various modifications and or alternations to fit particular applications without departing from the scope and the spirit of the present invention. For example, although the pulse width modulation period or the 1 PWM period is described as 8 reference clock periods in the above example, the present invention should not be restricted to such example and may be, for example, 16 reference clock periods or any other period. It is also possible to prepare only 1 kind of PWM pulse generator as shown in FIG. 1(B) and the odd patterns may be generated by selectively delaying the pulses by 1 reference clock period in order to produce the PWM pulses as shown in FIG. 1(A). Consequently, the first PWM pulses as shown in FIG. 1(A) and the second PWM pulses as shown in FIG. 1(B) are generated for the purpose of performing the time averaging process.

It is to be noted that the description has been made in the above preferred embodiment with the predetermined number N of the reference clock to be even. However, the predetermined number N is preferably even but not necessarily even and may be odd if necessary. Since odd patterns in such particular case coincide with the center position of the reference clock, needless to say that even patterns are to be switched by a switching circuit.

What is claimed is:

1. A pulse width modulation method for outputting patterns of a plurality of different pulse width by modulating both rising and falling portions of output pulses in a pulse width modulation (PWM) period including predetermined number N (N being any desired number larger than 1) of a reference clock in response to a data input characterized in that:

the output pulses are (N+1) kinds having the pulse width equal to 0~N times of the reference clock period and comprising even patterns with the centers of the pulses coinciding with the center of the PWM period and odd patterns with the centers of the pulses slightly shifting from the center of the PWM period, and time averaging process is performed for substantially equalizing the center of energy of the output pulses to the center of the PWM period.

2. A pulse width modulation method of claim 1, wherein the averaging process is performed by preparing 2 kinds of odd patterns of the output pulses to be switched alternately.

3. A pulse width modulation method of claim 1, wherein the averaging process is performed by alternately shifting the odd patterns of the output pulses by 1 reference clock period.

4. A pulse width modulation apparatus for generating (N+1) kinds of patterns of output pulses having the pulse width of 0~N times of a reference clock period in a pulse width modulation (PWM) period including predetermined number N (N being any number larger than 1) of the reference clock in response to a data input, comprising:
 a PWM pattern generator for generating 2 kinds of pulses including pulses among the (N+1) kinds of the output pulses with the pulse centers being shifted in the opposite directions from the center of the PWM period, and a switching circuit for selectively switching the output pulses from the PWM pattern generator.

5. A pulse width modulation apparatus of claim 4, wherein the PWM pattern generator comprises first and second PWM pulse generators for generating a plurality of odd patterns with the centers of the pulses being different from one another, and a pulse generator for generating a plurality of even patterns having the same center positions of the pulses.

6. A pulse width modulation apparatus for generating (N+1) kinds of patterns of output pulses having the pulse width of 0~N times of a reference clock period in a pulse width modulation (PWM) period including predetermined number N (N being any number larger than 1) of the reference clock in response to a data input, comprising:
 a PWM pattern generator for generating 2 kinds of pulses including pulses among the (N+1) kinds of the output pulses with the pulse centers being shifted in the opposite directions from the center of the PWM period, and a switching circuit for selectively switching the output pulses from the PWM pattern generator,
 wherein the PWM pattern generator comprises first and second PWM pulse generators for generating a plurality of odd patterns with the centers of the pulses being different from one another, and a pulse generator for generating a plurality of even patterns having the same center positions of the pulses, and
 wherein the switching circuit is controlled by a control circuit for switching the first and the second PWM pulse generators at every generation of any odd pattern.

7. A pulse width modulation apparatus of claim 5, for generating (N+1) kinds of patterns of output pulses having the pulse width of 0~N times of a reference clock period in a pulse width modulation (PWM) period including predetermined number N (N being any number larger than 1) of the reference clock in response to a data input, comprising:
 a PWM pattern generator for generating 2 kinds of pulses including pulses among the (N+1) kinds of the output pulses with the pulse centers being shifted in the opposite directions from the center of the PWM period, and a switching circuit for selectively switching the output pulses from the PWM pattern generator,
 wherein the PWM pattern generator comprises first and second PWM pulse generators for generating a plurality of odd patterns with the centers of the pulses being different from one another, and a pulse generator for generating a plurality of even patterns having the same center positions of the pulses, and
 wherein the switching circuit comprises a plurality of multiplexers (MUXs) for selectively outputting the outputs from the corresponding odd pulse generators in the first and second PWM pulse generators and an output multiplexer for receiving the outputs from the plurality of MUXs and the outputs from the pulse generators for the even patterns.

8. A pulse width modulation apparatus of claim 6, wherein the control circuit for the switching circuit comprises a data decoder and control circuits for the plurality of MUXs.

9. A pulse width modulation apparatus of claim 8, wherein each of the control circuits for the plurality of MUXs comprises a D-type flip-flop (D-FF) and an inverter connected between the Q output terminal and the D input terminal of the D-FF.

10. A pulse width modulation apparatus of claim 8, wherein the control circuit for MUX comprises a register, a comparator connected at the output side of the register and an adder for adding the outputs from the comparator and the register before being inputted to the register.

* * * * *